(12) United States Patent
Harada et al.

(10) Patent No.: US 7,482,735 B2
(45) Date of Patent: Jan. 27, 2009

(54) CRYSTAL OSCILLATOR

(75) Inventors: Masakazu Harada, Saitama (JP); Hidesada Takahashi, Oosaki (JP)

(73) Assignee: Nihon Dempa Kogyo Co., Ltd., Tokyo (JP)

( * ) Notice: Subject to any disclaimer, the term of this patent is extended or adjusted under 35 U.S.C. 154(b) by 0 days.

(21) Appl. No.: 11/906,696

(22) Filed: Oct. 3, 2007

(65) Prior Publication Data

US 2008/0084253 A1    Apr. 10, 2008

(30) Foreign Application Priority Data

Oct. 5, 2006  (JP) ............... 2006-274514
Sep. 7, 2007  (JP) ............... 2007-232928

(51) Int. Cl.
*H01L 41/04* (2006.01)
*H01L 41/08* (2006.01)

(52) U.S. Cl. ............... 310/348; 310/365; 331/158

(58) Field of Classification Search ............... 310/348, 310/363–366; 331/158
See application file for complete search history.

(56) References Cited

U.S. PATENT DOCUMENTS 6,452,311 B1 *  9/2002  Serizawa ............... 310/363
6,777,858 B2 *  8/2004  Bang et al. ............ 310/348
7,247,978 B2 *  7/2007  Robinson et al. ...... 310/345
2007/0200647 A1 *  8/2007  Koyama et al. ........ 333/129

FOREIGN PATENT DOCUMENTS

JP    3-226106    10/1991
JP    2001-24469   1/2001

* cited by examiner

*Primary Examiner*—Jaydi SanMartin
(74) *Attorney, Agent, or Firm*—Scott D. Wofsy; Edwards Angell Palmer & Dodge LLP

(57) ABSTRACT

The present invention relates to a crystal unit in which rectangular excitation electrodes are formed on two main surfaces of a rectangular crystal piece, an extracting electrode extends from at least one corner portion at each of two end portions from each of the excitation electrodes, and one of the corner portions of the crystal piece from which each extracting electrode extends is affixed by an electrically conductive adhesive to a step portion of the board, wherein a cutaway portion is provided in a corner portion of each of the excitation electrodes corresponding to one corner portion of the crystal piece, to increase the distance from the corner portion of the crystal piece, and the cutaway portion is formed as either a straight line or a curve. This provides a crystal unit in which contact between the excitation electrodes of the crystal piece and the electrically conductive adhesive is prevented, enabling reliable resonance.

5 Claims, 4 Drawing Sheets

CRYSTAL OSCILLATOR

FIELD OF THE INVENTION

The present invention relates to a crystal unit and, in particular, to a compact crystal unit in which the surface area of the excitation electrodes has been increased.

BACKGROUND OF THE INVENTION

A crystal unit is generally known as a frequency control element which is incorporated in various types of electronic appliance. One type thereof is an AT-cut crystal piece (crystal resonator) in which the resonance mode is the thickness-shear resonance mode, where the resonant frequency band is 2 to 40 MHz. Among such crystal units, beveling is generally used as the crystal piece becomes more compact, to ensure that the resonant frequency is within the 8-MHz band or below.

DESCRIPTION OF RELATED ART

An example of a crystal unit of the prior art is shown in FIG. 4, where FIG. 4A is a section therethrough in a lengthwise direction and FIG. 4B is a plan view with the cover removed. Note that excitation and extending electrodes are not shown in FIG. 4A.

In this prior-art, the crystal unit is formed of an AT-cut crystal piece 1 sealed within an airtight container 2. The crystal piece 1 has a rectangular shape in external plan view, has an inclined portion (bevel) at each of two end portions in the lengthwise and widthwise directions, and has a flatter portion in a central region thereof. The crystal piece 1 is inserted into a hollow container (not shown in the figures) of a shape such as cylindrical or spherical together with a grinding agent, and is beveled by grinding therein as the hollow container rotates.

The crystal piece 1 has an excitation electrode 3 on each of two main surfaces thereof, and an extracting electrode 4 extends from each of two end portions thereof. As shown in FIG. 4B, each excitation electrode 3 is rectangular when seen in plan view, and is formed to extend from the flatter portion over the inclined surfaces. In this case, each excitation electrode 3 has point symmetry about the center of the crystal piece 1. Each extracting electrode 4 is configured of a first extraction portion 4a that extends from the central portion of the corresponding end of the excitation electrode 3 and a second extraction portion 4b that is formed along the edges along the corresponding end portion. Each of the second extraction portions 4b is bent back to be formed on the opposite surface of the crystal piece 1 as well. Since this configuration ensures that the electrode pattern including the excitation electrodes 3 and the extending electrodes 4 is symmetrical between the two main surfaces, there is no directionality which simplifies subsequent processes such as that during the affixing of the crystal piece 1.

The airtight container 2 is configured of mounting boards 2b, 2c, and 2d and a cover 2a, all made of a ceramic material. A mounting board 5 comprising the boards 2b, 2c and 2d has a concave portion 2f in an inner base surface thereof, and the inner wall thereof has a step portion 2e. There is a crystal terminal (not shown in the figures) on each of the pair of opposing inner wall step portions in the long-edge direction. In addition, a central portion of each of the pair of opposing inner wall step portions has a groove. External terminals (not shown in the figures) are provided at the central regions of the two end portions of the outer base surface of the mounting board 5, and the crystal terminals are electrically connected thereto through the stacked surface and side surfaces.

Each end portion extending from the extracting electrode 4 of the crystal piece 1 is affixed by an electrically conductive adhesive 7 to the corresponding crystal terminal provided on the step portion 2e. In this case, the two edge sides of the second extraction portion 4b of the extracting electrode 4 are affixed to the corresponding crystal terminals. In other words, the four corner portions of the crystal piece 1 are affixed to the step portions of the mounting board 5. The cover 2a is made to be concave and an aperture edge surface thereof is affixed to the outer periphery of the mounting board 5 by melting glass (called a glass seal), so that the crystal piece 1 is hermetically sealed within the airtight container 2.

With this configuration, an inclined portion formed by beveling is provided on the outer periphery of the crystal piece 1, so that resonance energy is enclosed within the flatter portion thereof (central region), thus preventing any leakage of resonance energy or reflection from the edge surface. Since each excitation electrode 3 is formed to extend from the flatter portion of the crystal piece over the inclined portions, the utilization efficiency of the flatter portion that becomes the resonance region increases, thus promoting further miniaturization of a crystal unit with a small crystal impedance (hereinafter abbreviated to "CI"). Note that the concave portion 2f of the mounting board 5 prevents contact between the flatter portion of the crystal piece 1 and the inner base surface. (Refer to Japanese Patent Laid-Open Publication No. 3-226106 and Japanese Patent Laid-Open Publication No. 2001-24469.)

PROBLEM WITH THE RELATED ART

However, in the crystal unit of the above-described configuration, the surface area of each excitation electrode 3 is increased in order to reduce the CI, so that spacing between the second extraction portion 4b of each extracting electrode 4 and the corresponding excitation electrode 3 is reduced. Thus, when the four corner portions of the crystal piece 1 (the two edge sides of each of the first second extraction portions 4b) are affixed by adhesive to the step portion, there is a danger that any excess or adhesive or subtle displacement of the crystal piece 1 could result in contact between the electrically conductive adhesive 7 and the excitation electrodes 3, particularly the corner portions thereof.

In such a case, such as if the electrically conductive adhesive 7 should come into contact with one of the excitation electrodes 3 at one edge side at which the extracting electrode 4 extends from the excitation electrode 3 on one of the main surfaces of the crystal piece 1, this could induce a rise in the CI so that the resonance continues. Conversely, if the excitation electrode 3 on the other side of the crystal piece 1 comes into contact with the electrically conductive adhesive 7, electrical shorting could occur, so that the two main surfaces of the crystal piece 1 reach the same potential, making resonance impossible.

OBJECTIVE OF THE INVENTION

An objective of the present invention is to prevent contact between the excitation electrodes of the crystal piece and the electrically conductive adhesive, thus providing a crystal unit in which resonance is generated reliably.

SUMMARY OF THE INVENTION

The present invention relates to a crystal unit in which rectangular excitation electrodes are formed on two main surfaces of a rectangular crystal piece, an extracting electrode extends from at least one corner portion at each of two end portions from each of the excitation electrodes, and one of the corner portions of the crystal piece from which each extracting electrode extends is affixed by an electrically conductive adhesive to a step portion of the board, wherein a cutaway portion is provided in a corner portion of each of the excitation electrodes corresponding to one corner portion of the crystal piece, to increase the distance from the corner portion of the crystal piece, and the cutaway portion is formed as either a straight line or a curve.

EFFECTS OF THE INVENTION

Since the above-described configuration ensures that a cutaway portion of a straight-line or curved (semicircular) form is provided at each corner portion of the excitation electrode, the distance between the corresponding corner portion of the crystal piece, on which the electrically conductive adhesive is painted, and the corner portion of the excitation electrode is increased. Thus, contact between the electrically conductive adhesive and the excitation electrode can be prevented, even if too much adhesive is painted thereon or the crystal piece is displaced. Since this, therefore, prevents electrical shorting, resonance is generated reliably.

Note that not only can the present invention ensure a wider surface area for the excitation electrode, in comparison with the excitation electrode of the prior art having a rectangular form or rounded corner portions, but it can also enable an increased distance between excitation electrode and the corner portion of the crystal piece on which the electrically conductive adhesive is painted. This makes it possible to obtain a highly reliable crystal unit which has good resonance characteristics and which also prevents electrical shorting.

Since the present invention ensures that a cutaway portion is formed in each of the four corners of the excitation electrode, contact between all the corner portions of the excitation electrodes and the excitation electrodes by the electrically conductive adhesive can be prevented, when all of those four corners of the crystal piece are affixed to the step portions, suppressing deterioration of the resonance characteristics thereof.

In addition, the excitation electrode in accordance with the present invention has point symmetry around the center of the crystal piece, the length of the excitation electrode is between 60% and 75% of the length of the crystal piece, and the width of the excitation electrode is between 80% and 98% of the width of the crystal piece. This brings the corner portions of the excitation electrodes and the crystal piece closer, which has dramatic effects for preventing electrical shorting.

Furthermore, the crystal piece in accordance with the present invention has an inclined surface on an outer peripheral portion around a flatter portion at a central region thereof, and the excitation electrode is formed to extend over the inclined surface. This clearly defines the crystal resonator (crystal piece) applied to the present invention. The crystal unit of the present invention is particularly suitable for frequency bands for which beveling is necessary, such as crystal resonators for the 4-MHz band.

Still further, the extracting electrode in accordance with the present invention is formed of a first extraction portion which extends from a central portion at each of two ends of the crystal piece, from a central portion at each of two ends of the excitation electrode, and a second extraction portion along the edges of two end portions from the central portion of each of the two ends of the crystal piece. This ensures that the extending electrodes of the crystal piece extend from the four corner portions, defining positions at which the electrically conductive adhesive is painted.

BRIEF DESCRIPTION OF THE DRAWINGS

FIG. 1 is illustrative of a crystal unit of one embodiment of the present invention, where

FIG. 4 is illustrative of a crystal unit of the prior art, where

DETAILED DESCRIPTION OF PREFERRED EMBODYING EXAMPLES

Figure 1A:
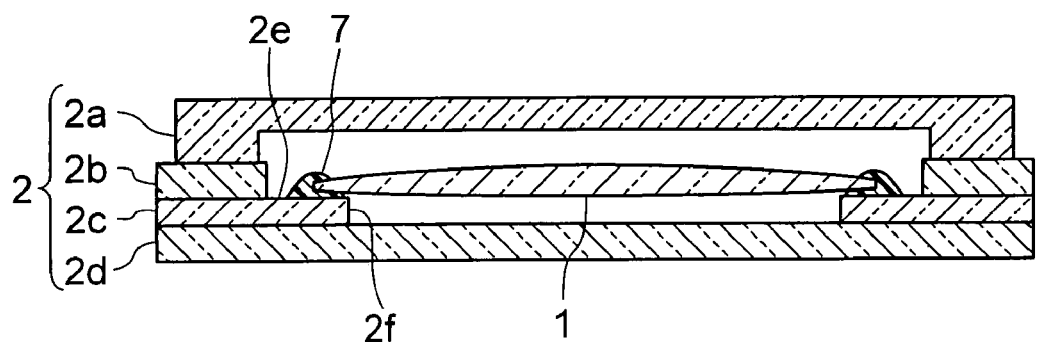
FIG. 1A is a section therethrough and FIG. 1B is a plan view with the cover removed.
Figure 1B:
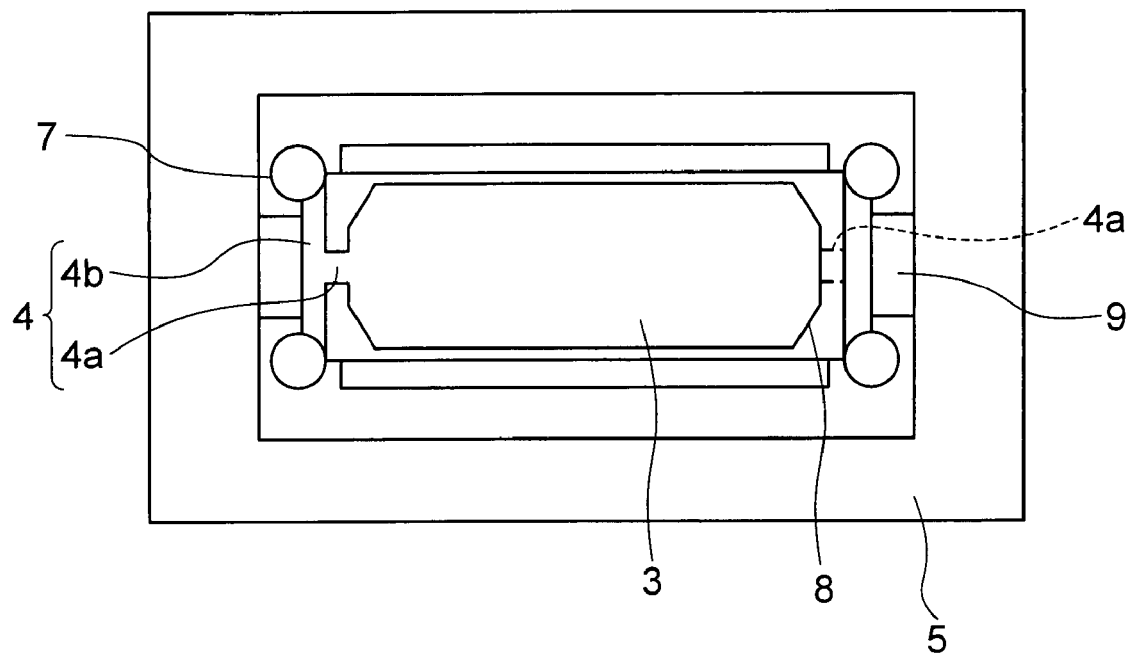

An embodiment of the crystal unit in accordance with the present invention is shown in FIG. 1, where FIG. 1A is a section therethrough and FIG. 1B is a plan view with the cover removed. Note that portions that are the same as those of the prior-art are denoted by the same reference numbers, and further description thereof is either abbreviated or omitted.

In the crystal unit of the present invention, the two end portions of the crystal piece 1 are retained (affixed) to the step portions 2e on the opposing inner walls of the mounting boards 2b, 2c, and 2d, and the cover 2a is connected thereto by a glass seal to hermetically seal the same into the airtight container 2, as described previously. The crystal piece 1 is ground within a hollow container, as described previously, and has a flatter portion in the central region thereof with an inclined portion (beveled portion) around the outer peripheral portion thereof. In this case, assume that the external dimensions in plan view (length×width) are 5.25×1.80 mm and the resonant frequency is 4-MHz (for a thickness of 0.42 mm), by way of example.

Each excitation electrode 3 is rectangular when seen in plan view and is formed with point symmetry about the center of the crystal piece 1, with external plan-view dimensions of 3.6×1.6 mm. The length thereof with respect to the crystal piece 1 is thus 68% and the width thereof is 88%. The four corner portions of the excitation electrode 3 are cut off so that a cutaway portion 8 in a roughly triangular shape with the vertex in that corner is provided.

This makes it possible to increase the distance from each excitation electrode 3 and the corresponding corner portions of the crystal piece 1. If the gap between each excitation electrode 3 and the corner portion of the crystal piece 1 is 0.78 mm before the cutaway portion 8 is provided, the provision of the cutaway portion 8 in this case makes that distance 1.05 mm, which is an increase of approximately 1.3 times. The two sides of the four corner portions of the crystal piece 1 are then affixed by the electrically conductive adhesive 7 to the crystal terminal (not shown in the figures) provided on the step portions of the opposing inner walls of the mounting board 5, as previously described.

This configuration ensures that the distance from the four corner portions of the crystal piece 1 is increased by the cutaway portions 8 of the excitation electrode 3. This prevents contact with the excitation electrode 3, even when the electrically conductive adhesive 7 is painted onto the four corner portions of the crystal piece 1. This makes it possible to prevent contact between the excitation electrodes 3 and the electrically conductive adhesive 7, particularly at the other end in the opposite direction from which each extracting electrode 4 extends, thus reducing electrical shorting and ensuring that the resonance is generated reliably.

Figure 2A:
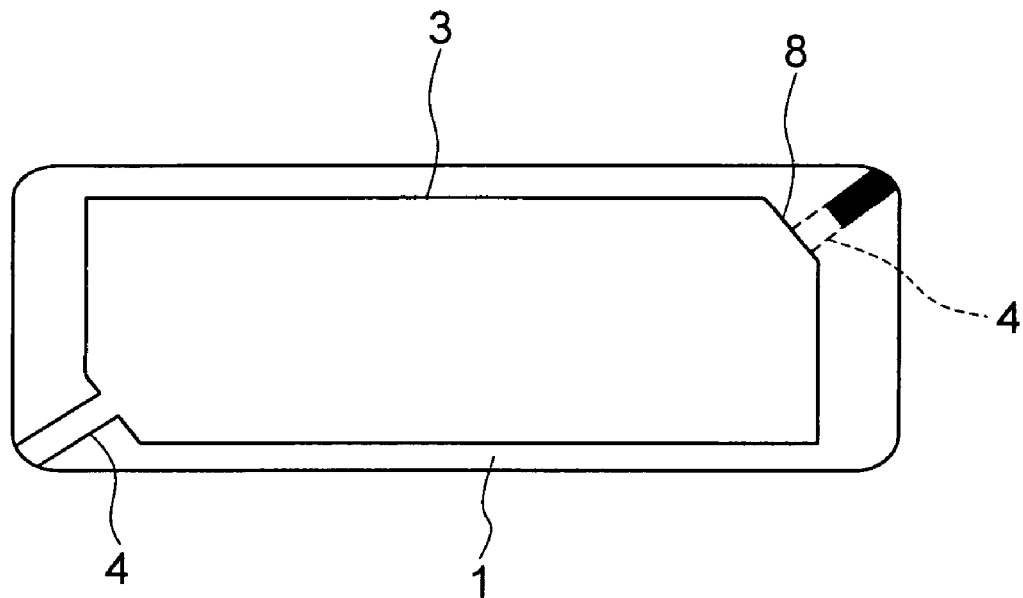
FIGS. 2A and 2B are plan views of other applications of the crystal piece used for the present invention.
Figure 2B:
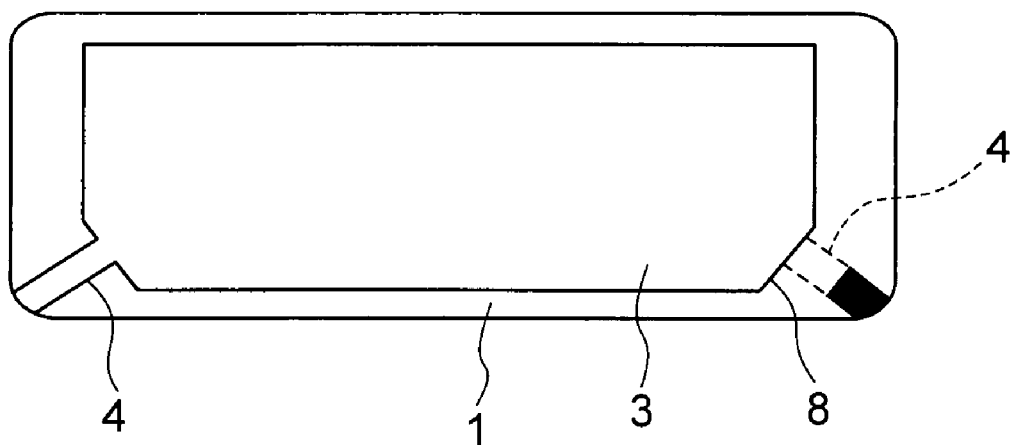

In the above-described embodiment, the four corner portions of the crystal piece 1 are affixed to the step portions by the electrically conductive adhesive 7, but the present invention is not limited thereto and can also be applied to configurations such as those shown in as shown in FIGS. 2A and 2B, in which one of the two sides at each of the two end portions (either the upper or lower edges in the figures) is affixed. For example, the extending electrodes 4 could extend from one pair of opposite corner portions (FIG. 2A), or from corner portions on the same edge (FIG. 2B). Note that the black parts in the figures denote a part of the extending electrodes that are bent back.

Figure 3:
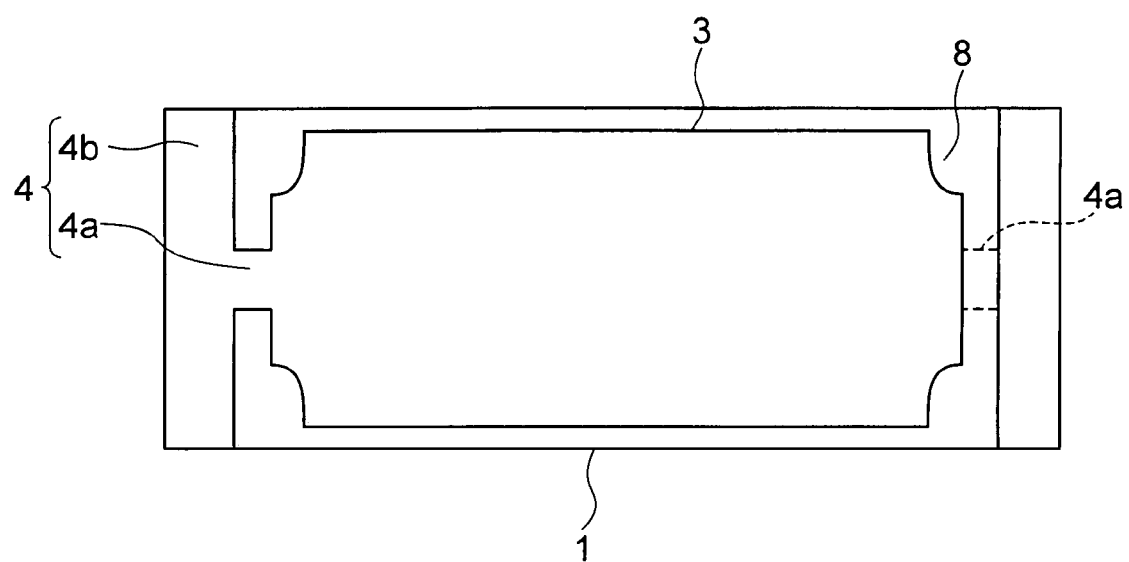
FIG. 3 is a plan view of an embodiment of a crystal piece in which each cutaway portion of the excitation electrodes is curved.
Figure 4A:
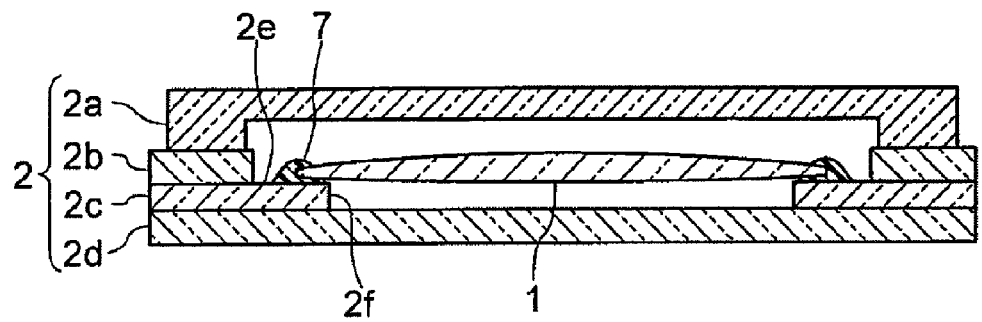
FIG. 4A is a section therethrough and FIG. 4B is a plan view with the cover removed.
Figure 4B:
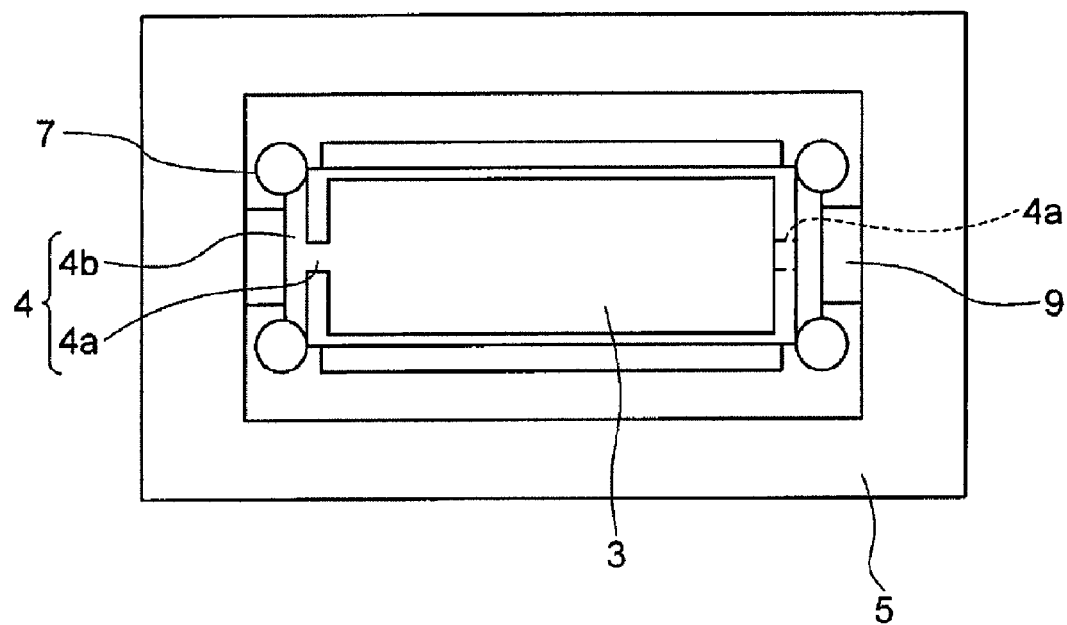

In the above-described embodiment, each cutaway portion 8 has a triangular shape, but the present invention is not limited thereto and thus each cutaway portion 8 could be cut away in a curve, as shown in FIG. 3, enough to prevent contact with the electrically conductive adhesive 7. The means of connecting the airtight container was described above as being a glass seal, but the present invention is not limited thereto and thus any connective means could be selected therefor, such as seam welding.

What is claimed is:

1. A crystal unit in which rectangular excitation electrodes are formed on two main surfaces of a rectangular crystal piece, an extracting electrode extends from at least one corner portion at each of two end portions from each of said excitation electrodes, and one of said corner portions of said crystal piece from which each of said extending electrodes extends is affixed by an electrically conductive adhesive to a step portion of the board, wherein a cutaway portion is provided in a corner portion of each of said excitation electrodes corresponding to one corner portion of said crystal piece, to increase the distance from said corner portion of said crystal piece, and said cutaway portion is formed as either a straight line or a curve.

2. The crystal unit according to claim 1, wherein a cutaway portion is formed in each of the four corners of said excitation electrode.

3. The crystal unit according to claim 1, wherein said excitation electrode has point symmetry around the center of said crystal piece, the length of said excitation electrode is between 60% and 75% of the length of said crystal piece, and the width of said excitation electrode is between 80% and 98% of the width of said crystal piece.

4. The crystal unit according to claim 1, wherein said crystal piece has a flatter portion in a central region thereof with an inclined surface on an outer peripheral portion thereof, and said excitation electrode is formed to extend over said inclined surface.

5. The crystal unit according to claim 1, wherein said extracting electrode is formed of a first extraction portion which extends from a central portion at each of two ends of said crystal piece, from a central portion at each of two ends of said excitation electrode, and a second extraction portion along the edges of two end portions from the central portion of each of said two ends of said crystal piece.

* * * * *